United States Patent
Hubner

(10) Patent No.: US 7,335,582 B2
(45) Date of Patent: Feb. 26, 2008

(54) COMPONENT

(75) Inventor: Holger Hubner, Baldham (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/974,542

(22) Filed: Oct. 27, 2004

(65) Prior Publication Data

US 2005/0121801 A1  Jun. 9, 2005

Related U.S. Application Data

(63) Continuation of application No. PCT/DE03/00787, filed on Mar. 12, 2003.

(30) Foreign Application Priority Data

Apr. 30, 2002  (DE) .............................. 102 19 353

(51) Int. Cl.
*H01L 23/52*  (2006.01)
*H01L 23/48*  (2006.01)

(52) U.S. Cl. ................. 438/612; 438/612; 438/613; 438/614; 438/15; 438/108; 257/777; 257/778

(58) Field of Classification Search ........ 257/777–778, 257/E27.137, E27.144, E27.161; 438/612–614, 438/15, 108
See application file for complete search history.

(56) References Cited

U.S. PATENT DOCUMENTS 5,811,351 A * 9/1998 Kawakita et al. ........... 438/613
6,137,164 A * 10/2000 Yew et al. ................... 257/686
6,326,088 B1 * 12/2001 Mayer et al. ............... 428/615
6,396,156 B1 * 5/2002 Tang et al. .................. 257/779
6,448,636 B2 * 9/2002 Suenaga et al. ............ 257/678
6,734,556 B2 * 5/2004 Shibata ....................... 257/737
2002/0017707 A1  2/2002 Suenaga et al.
2003/0197282 A1 * 10/2003 Tsai et al. ................... 257/777

FOREIGN PATENT DOCUMENTS

DE          19531158 A1 *  2/1997
DE         101 24 774 A1   12/2002
EP          0 908 952 A2    4/1999
JP          2000-223517 A   8/2000
JP          2000-340745 A  12/2000
RU              2006990     1/1999

* cited by examiner

*Primary Examiner*—Kenneth Parker
*Assistant Examiner*—Joseph Nguyen
(74) *Attorney, Agent, or Firm*—Dickstein, Shapiro, LLP.

(57) ABSTRACT

Semiconductor component, having a first chip arranged on a second chip, in which the first and second chips in each case have, on one of their main areas, first and second metalizations, respectively, which face one another. First regions of the metalizations are provided for the production of an electrical connection between the first and second chips. Second regions of the metalization are provided as an additional electrical functional plane outside the first and second chips.

15 Claims, 3 Drawing Sheets

COMPONENT

CROSS-REFERENCE TO RELATED APPLICATION

This application is a continuation of International Patent Application Serial No. PCT/DE2003/000787, filed Mar. 12, 2003, which published in German on Nov. 13, 2003 as WO 2003/094234, and is incorporated herein by reference in its entirety.

FIELD OF THE INVENTION

The invention relates to a component, in particular a semiconductor component, having a first chip arranged on a second chip, and in which the first and second chips have an electrical connection to one another.

BACKGROUND OF THE INVENTION

The arrangement of two chips one above the other and their electrical interconnection is also referred to as "vertical circuit integration". One possibility for producing the electrical connection between the first and second chips is the use of bonding wires. In this connection method, one of the two chips has a significantly larger base area than the other. Each of the two chips has bonding pads on its active main side, said bonding pads being located in a region at the edge, for example, in the case of the larger chip, so that the smaller chip cannot be placed into the central region that is not provided with bonding pads. Finally, the electrical connection is produced by bonding wires between respective bonding pads.

Another possibility consists in using conductive adhesives or soldering balls for producing the electrical connection. In both variants, the active main areas of the first and second chips face one another, so that respective contact areas are located opposite one another. Point contacts are then produced by means of the conductive adhesive or the solder balls. Shear forces on account of thermal stresses can therefore lead to an impairment of the electrical contact.

In the variants described hitherto, the diameter of the bonding pads or of the contact areas is between 70 and 100 µm. The distance between two bonding pads or external contact areas is likewise of the order of magnitude mentioned.

The provision of additional electrical functions in the case of an electrical connection by means of bonding wires, conductive adhesives or solder balls requires extensive design changes with regard to the arrangement of the first and second chips on one another and the electrical connection of individual bonding pads or external contact areas.

An alternative connection method for producing an electrical connection between the first and second chips is the so-called "diffusion soldering method". In the latter, the first and second chips are arranged with their active main areas in relation to one another. Situated on a respective active main area is a first and second metalization, which face one another. The first and second metalizations may be embodied in the form of a copper layer with a respective thickness of 1 to 5 µm. In order to produce an electrical connection, an additional thin solder layer, e.g. made of tin, with a thickness of between 0.5 and 3 µm is introduced between the first and second metalizations. The total thickness comprising the first and second metalizations and the solder layer lying in between is typically less than 10 µm. Thus, in comparison with the connection methods mentioned in the introduction, here an additional thin metal plane is produced which can be patterned in a range of 1 µm on account of its small thickness.

SUMMARY OF THE INVENTION

An object of the present invention, therefore, is to specify a component in which additional electrical functions can be realized in a simpler manner.

The invention proposes a component, in particular a semiconductor component, having a first chip arranged on a second chip, in which the first and second chips in each case have, on one of their main areas, first and second metalizations, respectively, which face one another. First regions of the first and second metalizations are provided for the production of an electrical connection between the first and second chips. Second regions of the first and/or second metalization are provided as an additional electrical functional plane outside the first and second chips.

The expression "additional electrical functional planes outside the first and second chips" is to be understood such that the electrical functional plane is not formed in the substrate of the first or second chip, but rather outside that. In this case, the additional electrical functional plane need not serve primarily for the electrical connection of the first and second chips, rather it may constitute a structure that is independent of the first and second chips. By way of example, a passive structure containing coils and delay lines might be involved.

The component thus utilizes the diffusion soldering method described in the introduction for producing an electrical connection between the first and second chips. Furthermore, in addition to merely producing the electrical and mechanical connection, the metal layers present are adopted for performing further electrical functions. This allows the overall construction of the component to be realized particularly inexpensively and with high functionality. In particular, the component according to the invention enables a higher yield of chips per wafer since the respective base areas of the first and second chips can be kept small on account of the connection technology. Furthermore, the component according to the invention makes it possible to save one or more additional wiring planes and, moreover, provides for a shielding of the circuit planes in the first and second chips.

This further electrical functional plane becomes possible by virtue of the fact that the metal layers used during a diffusion soldering method can be patterned down into a range of 1 µm on account of their small thickness. In this case, the patterning fineness is limited only by the choice of lithography, by the alignment accuracy of the tool which arranges the first and second chips one above the other, and also by instances of solder being pressed out. Structures of down to 3 to 5 µm can be resolved using a customary proximity lithography. Contact lithography, which is likewise often used, even enables structures of down to 1 to 2 µm. If a longer alignment time is accepted for positioning the first and second chips one above the other, then an accuracy of 1 µm can also be achieved here. The instances of solder being pressed out in the range of 1 to 2 µm are unavoidable, in principle, but can be avoided by the application of further measures. By way of example, the first and second metalizations coated with a solder can be made 1 to 5µ larger than the solder to be applied thereto. Although this counterbalances instances of solder being pressed out, a lower degree of patterning fineness is achieved, however.

The first and/or second metalization are/is expediently connected via contact material elements to contact pads located in a topmost metalization layer. The topmost metalization layer is situated within the substrate of a respective chip. It represents the circuit plane located nearest to the active main area, the active main area representing a main side of a chip. In contrast to conventional arrangements in which the contact pads are located in the topmost metalization layer, that is to say in the "interior" of the chip and can be contact-connected directly, e.g. by means of bonding wires or solder balls, the first and/or second metalization is located directly on the respective main area of the first and/or second chip.

In contrast to conventional arrangements, the contact pads that are electrically connected to one another need not be located directly opposite.

Consequently, the additional electrical functional plane outside the first and second chips provides an additional metal layer as a further wiring plane.

Preferably, the first or second chip has no metalization at the locations at which the chip lying opposite has second regions of the metalization, so that the second regions can perform an electrical function for the operation of the chip lying opposite. The further wiring plane is thus situated directly between the first and second chips. In order to avoid short circuits, a corresponding "window" is therefore left free on one of the main areas of the chips lying opposite.

In a further refinement of the invention, the first chip may have different sizes, in which case it is permitted to be smaller than, the same size as or larger than the second chip. The second chip has second regions of the second metalization at least outside an overlap region formed between the smallest first chip and the main area of the second chip. The second regions of the second metalization which are located outside the overlap region may advantageously be used as a coding.

It is preferred if in the case where a larger first chip is arranged on the second chip, the second regions of the second metalization can be contact-connected by the first metalization of the first chip. The second regions of the second metalization thus preferably comprise two metal areas which are initially not electrically connected to one another. If these two metal areas lie outside the overlap region between first and second chip, then the connection remains open. However, the arrangement of a larger first chip on the second chip can result in a connection of the two metal areas, whereby the second chip acquires information about the size or the type of the first chip.

In another refinement, after the first chip has been arranged on the second chip, the second regions of the second metalization may also enable a coding by interruption or connection of conductor tracks or metal areas which are part of the second regions. The second regions must then be located outside the overlap region between the first and second chips. The electrical connection of conductor tracks in the second regions can be contact-connected by subsequently applied conductive material, e.g. a solder or conductive adhesive. The electrical connection of two conductor tracks could be interrupted by means of a laser, for example.

Preferably, the second regions of the first and/or second metalizations comprise test pads located within the overlap region of the first and second chips. As long as the first and second chips have not yet been connected to one another, the test pads are accessible in unimpeded fashion. By contrast, after the first and second chips have been joined together, access is no longer possible since the test pads are then located within the overlap region of the first and second chips.

Preferably, after the first chip has been arranged on the second chip, the test pads on the first or second chip are brought into mechanical contact with second regions of the metalization on the chip lying opposite. In accordance with the procedure for producing an electrical connection, the test pads are connected by means of a solder layer to a metalization on the chip lying opposite. The metalization on the chip lying opposite preferably has an electrical function in this case. This procedure allows a stable mechanical connection between the first and second chips, without the use of a further connecting means, such as e.g. an adhesive.

Accordingly, second regions of the first and second metalizations that lie directly opposite one another also serve for the mechanical fixing of the first and second chips. Therefore, if possible, the second regions should be embodied in planar fashion in the overlap region between the first and second chips.

Preferably, the second regions that lie opposite one another and serve for mechanical fixing are designed in the form of a ring surrounding the first regions of the first and second metalizations. As a result, the first regions of the metalizations lying in the interior of the ring are hermetically sealed and protected against corrosion by moisture. The corrosion resistance of the surfaces can furthermore be improved by subsequently gold-plating the component by immersion.

BRIEF DESCRIPTION OF THE DRAWINGS

The invention is described in more detail with reference to the figures below, in which:

FIG. 2b shows a sectional view of the arrangement of FIG. 2a;

FIG. 3b shows a sectional view of the arrangement of FIG. 3a;

DETAILED DESCRIPTION OF THE PREFERRED MODE OF THE INVENTION

Figure 1:
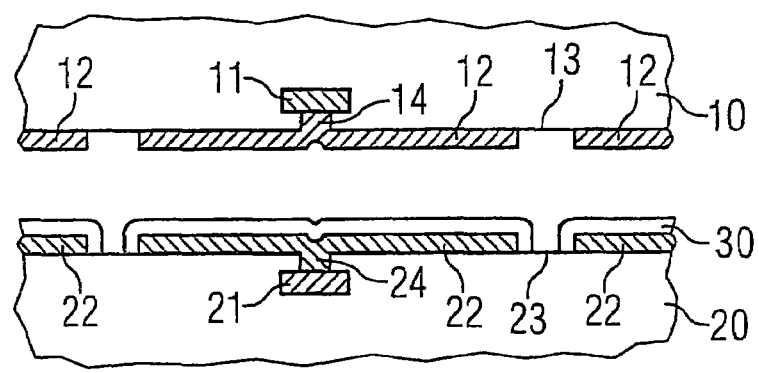
FIG. 1 shows a component in cross section before the connection of a first and second chip by means of a diffusion solder method.

FIG. 1 shows, in cross section, a component before the connection of a first chip 10 to a second chip 20 by means of a diffusion soldering method. The first chip 10 and the second chip 20 in each case have, by way of example, a contact pad 11 and 21, respectively, on their active main area 13 and 23, respectively, the contact pad in each case being located in the topmost metal layer of the chips 10, 20.

The first chip 10 has a first metalization 12 on its active main area 13. The metalization 12 is divided into regions that are electrically isolated from one another. In the figure, one of these regions is electrically connected to the contact pad 11 via a contact material element designated as plated-through hole 14. An essential characteristic of the diffusion soldering method is that a region of the first metalization 12 that is connected to the contact pad 11 has a significantly larger area.

Correspondingly, a second metalization 22 is formed on the active main area 23 of the second chip 20. The second metalization is likewise subdivided into regions that are electrically isolated from one another. In the figure, one of these regions is connected to the contact pad 21 via a plated-through hole 24.

Those regions of the first and second metalizations 12, 22 which have an electrical connection to bonding pads 11, 21 and are later intended to be electrically connected to one another are referred to below as first regions of the respective metalization.

The first and second metalizations 12, 22 are usually composed of copper and each have a thickness of approximately 1 to 5 µm. A further metal layer 30, which is composed of tin, for example, and has a thickness of between 0.5 and 3 µm, is applied to one of the metalizations 12 or 22.

Normally, the regions formed in the first and second metalizations 12, 22 are configured identically, so that they are assigned to one another during the alignment of the first chip 10 above the second chip 20. This results in a large-area connection plane, as a result of which the first and second chips 10, 20 are connected stably to one another.

Whereas in the arrangements known from the prior art the metalizations are used only for producing an electrical and/or mechanical connection, the invention provides for regions of the metalization to be used as an additional electrical functional plane located outside the first and second chips.

Figure 2A:
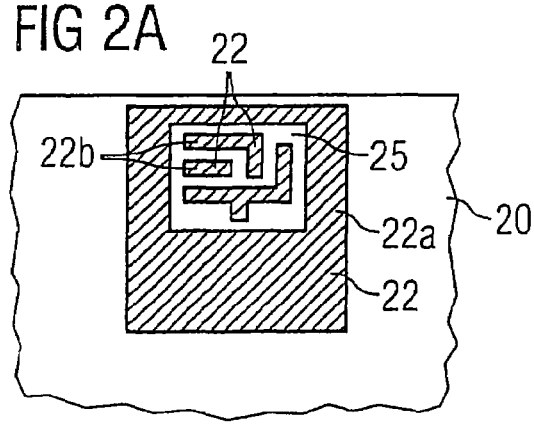
FIG. 2a shows the plan view of a second chip in which parts of the metalization are utilized as a further wiring plane.

FIG. 2a shows a first exemplary embodiment in a plan view. The illustration shows a detail from the second chip 20, which is also referred to as bottom chip. The second metalization 22 has first regions 22a, which are provided for producing an electrical connection between the bottom chip 20 and the first chip or top chip 10 revealed in FIG. 2b. By way of example, the first region 22a is of annular configuration. Second regions 22b, which are designed in the form of conductor tracks, are provided in a cutout 25 of the first region 22a of the second metalization 22. As can be seen better in FIG. 2b, the top chip 10 has no metalization in this region. The second regions 22b thus represent an additional wiring plane on the active main area 23 of the bottom chip 20. Accordingly, the second regions 22b are connected to the contact pads 21 via plated-through holes 24.

The use of the metalization as a further wiring plane is only possible because the metalizations can be patterned into a range down to 1 µm on account of their small thickness. In the case of such a configuration, it is expedient, in order to avoid short circuits, if a corresponding window is left free in the metal layer of the opposite chip side. The window expediently has the dimensions of the cutout 25 in the second metalization 22a.

Figure 2B:
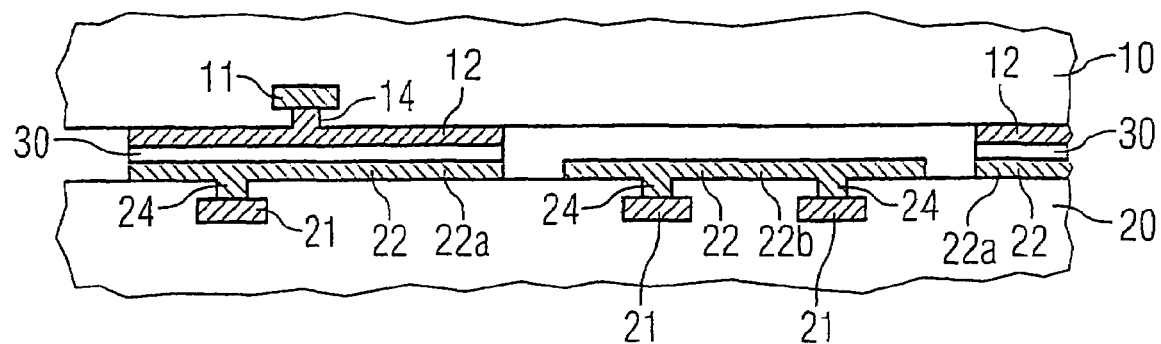

It can also be seen well from FIG. 2b that the contact pads 11, 21 are located in a manner offset with respect to one another. An arrangement lying opposite is not necessary since the electrical connection via the metalizations 12, 22 allows an arbitrary position of the contact pads 11, 21.

Figure 3A:
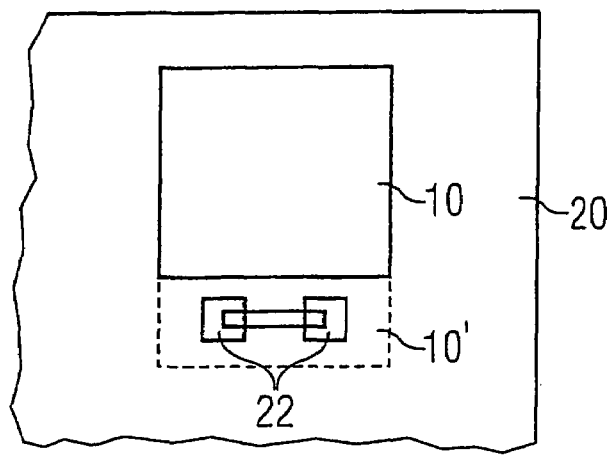
FIG. 3a hows an exemplary embodiment in which second regions of the metalization are provided for a coding.
Figure 3B:
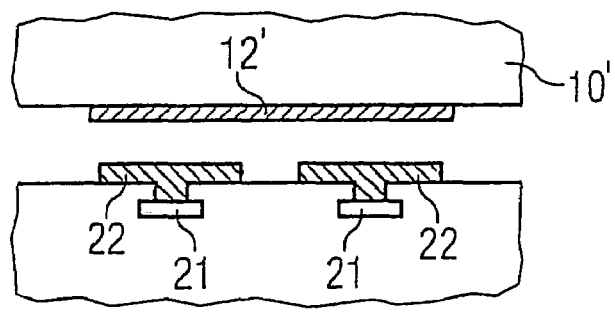

FIGS. 3a and 3b show a further exemplary embodiment, in which the second regions of a metalization are used for coding. FIG. 3a illustrates a plan view of the component according to the invention. There is applied on the bottom chip 20 a top chip 10 (solid line) or alternatively a somewhat larger top chip 10' (which is larger than the chip 10 by the dashed region). The second regions of the metalization 22 are applied in the form of two metal areas. The metal areas or second regions of the metalization 22 lie outside an overlap region of the smaller top chip 10 is applied on the bottom chip 20. By contrast, if the larger top chip 10' is provided for connection to the bottom chip 20, then the second region 22 lies within the overlap region of the two chips. The top chip 10' then preferably has a region 12' in the metalization 12, so that the region produces an electrical connection between the two metal areas of the second metalization 22. In this way, the bottom chip 20 is able to recognize whether a top chip 10 or a top chip 10' is involved.

This application is of particular interest when the bottom chip 20 and the top chip 10, 10' are of different types. Thus, one of the two chips might be a processor chip, for example, while the other constitutes a memory. The component can then be fabricated outside the wafer production. This procedure obviates expensive embedded processes. In particular, it is possible e.g. to fabricate a processor with memories of different sizes, without even only a single lithography mask having to be altered for this purpose.

A bottom chip 20 embodied as a processor chip could identify what memory chip 10, 10' it has been connected to simply by "interrogation" of the area size of the top chip. For this purpose, second regions of the second metalization are provided on the bottom chip outside the area edge of the smallest top chip 10, which second regions are contact-connected by a corresponding bridge (metalization 12') upon emplacement of a larger top chip. Such a coding could, of course, also be effected within the chip area of the smaller top chip 10.

In general, by means of corresponding contact areas and bridge combinations, it is possible to realize general coding functions according to the model of conventional jumpers, in which case the contact areas and bridges may optionally be situated both on the bottom chip and on the top chip.

Figure 4:
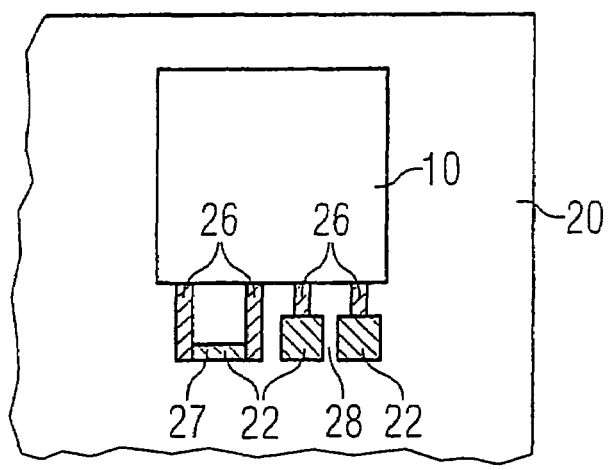
FIG. 4 shows a further exemplary embodiment in which the second regions of the metalization are provided as a coding.

By way of example, codings can also be performed on the finished component by leading out conductor tracks 26 beyond the area edge of the top chip 10. For this purpose, it is necessary merely for the corresponding connections to be severed (insulation region 28), e.g. by means of a laser or for corresponding conductor tracks to be contact-connected by means of a connecting element 27, e.g. a conductive adhesive or solder. Such a variant is illustrated in FIG. 4.

In this way, discrete components, e.g. resistors or capacitors, could likewise be applied to the bottom chip 20 and be connected to the conductor tracks 26.

Figure 5:
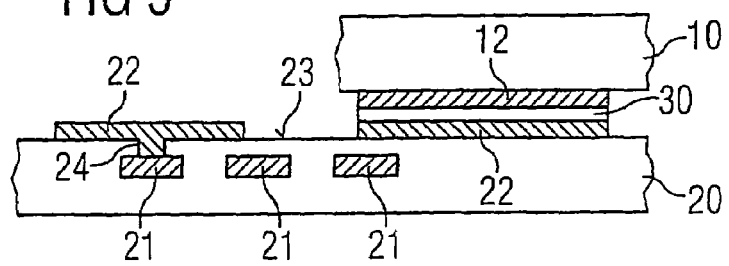
FIG. 5 shows a cross section through the component in which the second regions of the metalization are embodied as bonding pads.

FIG. 5 shows a further exemplary embodiment of the component according to the invention in cross section. In this exemplary embodiment, too, the bottom chip 20 is larger than the top chip 10. A large-area metalization 22 is provided in the region outside the overlap region and is connected to a contact pad 21 via a plated-through hole 24. The small contact pad in the topmost metalization layer is thus led to a large contact area. This contact area may have an area of $100 \times 100$ µm$^2$ in this case. This freely accessible metal area can be used for a further contact connection with a bonding wire. The surface of this freely accessible metalization area 22 is preferably gold-plated by immersion.

This variant affords the possibility of not having to provide any bonding areas in the region of the topmost metalization layer in one chip. The bonding areas are realized only at the time of preassembling on the main area of the chip and are connected to the integrated circuit via small plated-through holes having a diameter of approximately 1 µm squared. This makes it possible to reduce the chip area, as a result of which the yield on a wafer increases. Furthermore, the area of this bonding metalization can be greatly enlarged compared with a conventional method.

Figure 6:
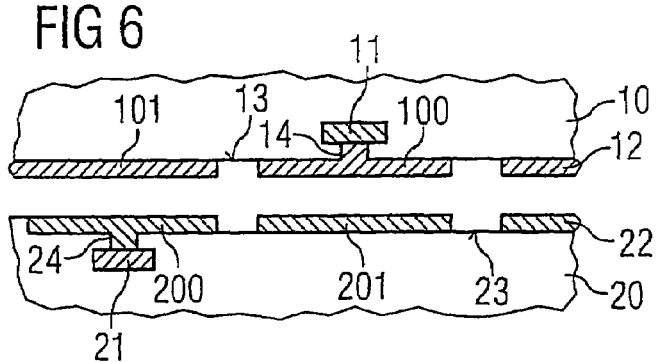
FIG. 6 shows a cross section through the component in which the second regions of respective metalizations are embodied as test pads.

FIG. 6 shows a further exemplary embodiment, in which the top chip 10 has a test pad 100, which is connected to a contact pad 11 via a plated-through hole 14. The test pads are required for checking the functionality only during the production of a chip. Once correct functionality has been ascertained, access to the test pads is no longer necessary. According to the invention, the test pad 100 is connected to a metalization 201, which is part of the second region of the second metalization of the bottom chip 20, thereby bringing about a stable fixing between the two chips. In a corresponding manner, a test pad 200 is provided on the main area of the bottom chip 20, which test pad is connected to a metalization 101 likewise without an electrical function—in the metalization 12 of the top chip 10.

Compared with the arrangements known from the prior art, no additional area is required for the test pads. In exactly the same way as the contact pads from FIG. 5, the test pads 100, 200 are realized only by means of the first and the second metalization, respectively. It is particularly advantageous for these areas to be located in the region of the smaller top chip 10. After the test, the test pads are thus used for the mechanical connection of the chips, especially as a large part of the areas outside the first regions of the metalizations is originally used as "dummy areas" merely for the purpose of mechanical connection and heat dissipation. Thus, some of these existing areas are additionally used beforehand for the functional test of the chip. The testing should advantageously be effected on the entire wafer after application and patterning of the respective metalizations. After the test, the wafer comprising the second chips, for example, can be tin-coated in the electroless immersion bath, only the open metalizations being coated with the thin solder layer required. The chips are thus produced in what is referred to as the "front end". This is followed by, in "preassembly", the preparation of the bonding pads, the circuit tests and also the tin-coating and the vertical integration, that is to say the connection of first and second chips. Afterward, mounting into the housing is effected in the "back end". The circuit test is thus integrated into the process flow of the mounting technique.

Generally, during the diffusion soldering method, it is endeavored to achieve an as far as possible whole-area connection of the two chips, since a good thermal conduction and a good mechanical contact are sought. For this purpose, those second regions of the metalization which have no electrical function can be left as dummy areas. However, these areas can also advantageously be used as shielding in order to electrically decouple the circuits in the first and second chips from one another. This becomes necessary particularly in the context of the increasingly rising operating frequencies and switching speeds.

Figure 7A:
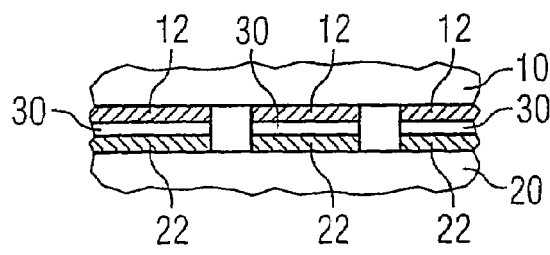
FIGS. 7a and 7b each show a cross section through the component in which the second regions of respective metalizations are designed as a stripline.
Figure 7B:
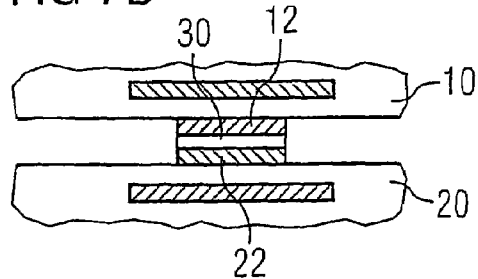

FIG. 7a shows an exemplary embodiment in which the second regions of the metalizations are embodied as coplanar strip lines or, in connection with one or the two respective topmost metal planes of the chips, as a normal strip line (FIG. 7b). This variant is of interest for input/output lines of radiofrequency circuits.

Figure 8:
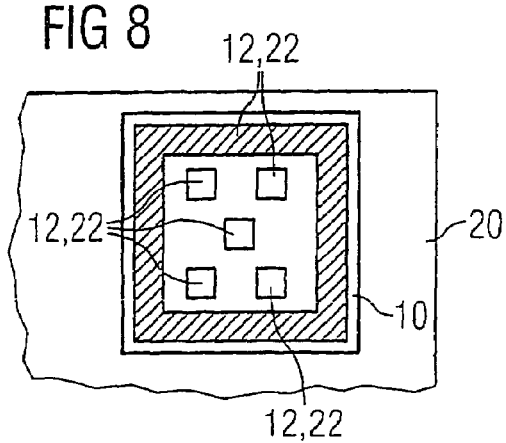
FIG. 8 shows a plan view of the component in which the second regions of the metalization are designed as a closed ring.

In the exemplary embodiment of FIG. 8, the second region of the metalizations 12, 22 is formed annularly around the first regions of the metalizations 12, 22. The closed ring made of metal seals the contacts located in the first regions of the metalizations hermetically against corrosion through moisture. The corrosion resistance of the surfaces can furthermore be improved by subsequently gold-plating the component by immersion.

The invention claimed is:

1. A method for assembling a semiconductor component, comprising:
   providing a first chip having a first planar metallization on its main area;
   providing a second chip having a second planar metallization on its main area;
   providing first regions of the metallizations for an electrical connection between the first chip and the second chip;
   providing the second chip with a second region of the second metallization;
   providing the first chip in an overlapping region of the first and second chips with
   a second region of the first metallization which has no connection to an electrical circuit of the first chip, in an area where the second chip provides the second region of the metallization, so that the second region of the metallization of the first chip can take on an electrical function for the operation of the second chip; and
   arranging the first chip on the second chip.

2. The method as claimed in claim 1, wherein the first and/or second metallizations are/is connected via contact material elements to bonding pads located in a topmost metallization layer.

3. The semiconductor component as claimed in claim 2, wherein the bonding pads located in the topmost metallization layers are axially offset from one another.

4. The method as claimed in claim 1, wherein the first chip is one of a plurality of sizes, the first chip being smaller than the second chip, and the second chip having second regions of the second metallization at least outside an overlap region formed between the smaller first chip and the main area of the second chip,
   the method further comprising:
      arranging a larger one of the plurality of sizes of the first chip on the second chip; and
      contact-connecting the second regions of the second metallization to the first metallization of the first chip,
      wherein the second regions of the second metallization enable a coding by interruption or connection of conductor tracks of the second regions of the second metallization.

5. The method as claimed in claim 4, wherein the second regions of the first and/or second metallization comprise test pads located within the overlapping region of the first and second chip.

6. The method as claimed in claim 5, further comprising bringing the test pads on the first or second chip into mechanical contact with second regions of the metallization on the chip lying opposite.

7. The method as claimed in claim 1, wherein the second regions of the first and second metallizations that lie directly opposite one another mechanically fix the first and second chips.

8. The method as claimed in claim 1, wherein the second regions that lie opposite one another and serve for mechanical fixing are designed in a form of a ring that encloses the first regions of the first and second metallizations.

9. The method as claimed in claim 1, wherein the second regions of each of the first and second metallizations are designed in a form of a strip line.

10. The method as claimed in claim 1, wherein the metallizations are planar layers each having a thickness of 1 to 5 µm.

11. The method as claimed in claim 1, wherein the metallizations each are composed of copper.

12. The method as claimed in claim 1, wherein a further metal layer located between the first and second planar metallizations has a thickness of 0.5 to 3 µm.

13. The method as claimed in claim 1, wherein a further metal layer located between the first and second planar metallizations is composed of tin.

14. The method as claimed in claim 1, wherein the first or second chip has no metallization at locations where the first and second chip overlap and at which the chip lying opposite has the second regions of the metallization, so that the second regions perform an electrical function for an operation of the chip lying opposite.

15. The method as claimed in claim 1, wherein the second regions of at least one of the first and second metallizations are used for shielding circuit planes in the first and second chips.

* * * * *

UNITED STATES PATENT AND TRADEMARK OFFICE
CERTIFICATE OF CORRECTION

PATENT NO. : 7,335,582 B2  Page 1 of 1
APPLICATION NO. : 10/974542
DATED : February 26, 2008
INVENTOR(S) : Holger Hubner It is certified that error appears in the above-identified patent and that said Letters Patent is hereby corrected as shown below:

On the title page, item (56) References Cited

Under Foreign Patent Documents, "RU  2006990  1/1999" should read --RU  2006990  1/1994--

In the Specification:

At column 2, line 65, "5μ" should read --5μm--

At column 4, line 43, "hows" should read --shows--

At column 7, lines 26, "101 likewise" should read --101 – likewise--

Signed and Sealed this

Twenty-second Day of July, 2008

JON W. DUDAS
*Director of the United States Patent and Trademark Office*